United States Patent

[11] 3,611,069

[72] Inventors Simeon V. Galginaitis; Gunther E. Fenner; Rogers S. Ehle, all of Schenectady, N.Y.

[21] Appl. No. 875,917

[22] Filed Nov. 12, 1969

[45] Patented Oct. 5, 1971

[73] Assignee General Electric Company

[54] MULTIPLE COLOR LIGHT EMITTING DIODES
7 Claims, 5 Drawing Figs.

[52] U.S. Cl. .................... 317/235 R, 317/235 N, 317/235 AC, 317/235 W, 250/211, 250/217, 148/176

[51] Int. Cl. .................... H01l 15/00

[50] Field of Search .................... 317/235 (27), 235 (42), 235 N, 235 R, 235 W; 250/211 J, 83, 217 SS, 235

[56] References Cited

UNITED STATES PATENTS

| | | | |
|---|---|---|---|
| 3,478,214 | 11/1969 | Dillman | 250/211 |
| 3,404,305 | 10/1968 | Wright | 313/108 |
| 3,526,801 | 9/1970 | Kruse | 313/108 |

OTHER REFERENCES

Shih et al., I.B.M. Technical Disclosure Bulletin Vol. 12, No. 1, June 1969, page 162.

Marinace, I.B.M. Technical Disclosure Bulletin, Vol. 6, No. 2, July 1963, page 82.

Fischler, I.B.M. Technical Disclosure Bulletin, Vol. 11, No. 3, Aug. 1968.

*Primary Examiner*—John W. Huckert
*Assistant Examiner*—Martin H. Edlow
*Attorneys*—Paul A. Frank, John F. Ahern, Jerome C. Squillaro, Frank L. Neuhauser, Oscar B. Waddell and Joseph B. Forman

ABSTRACT: Multiple color light-emitting semiconductor structures and methods for fabricating them are disclosed. The light-emitting structures comprise multiple-layered regions of differing conductivity-type semiconductor materials such as compositions of gallium phosphide which are made to emit light of selectively different wavelengths. The characteristics of the light-emitting structures are enhanced by lowering the optical absorption of high-energy photons by the use of a material with an increased band-gap.

Fig. 1.
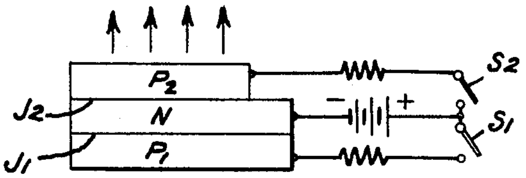
Fig. 2.
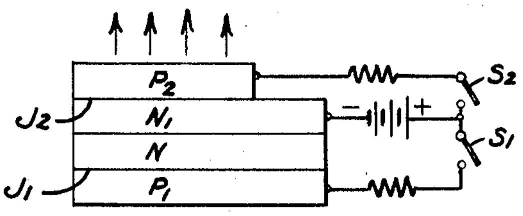
Fig. 3.
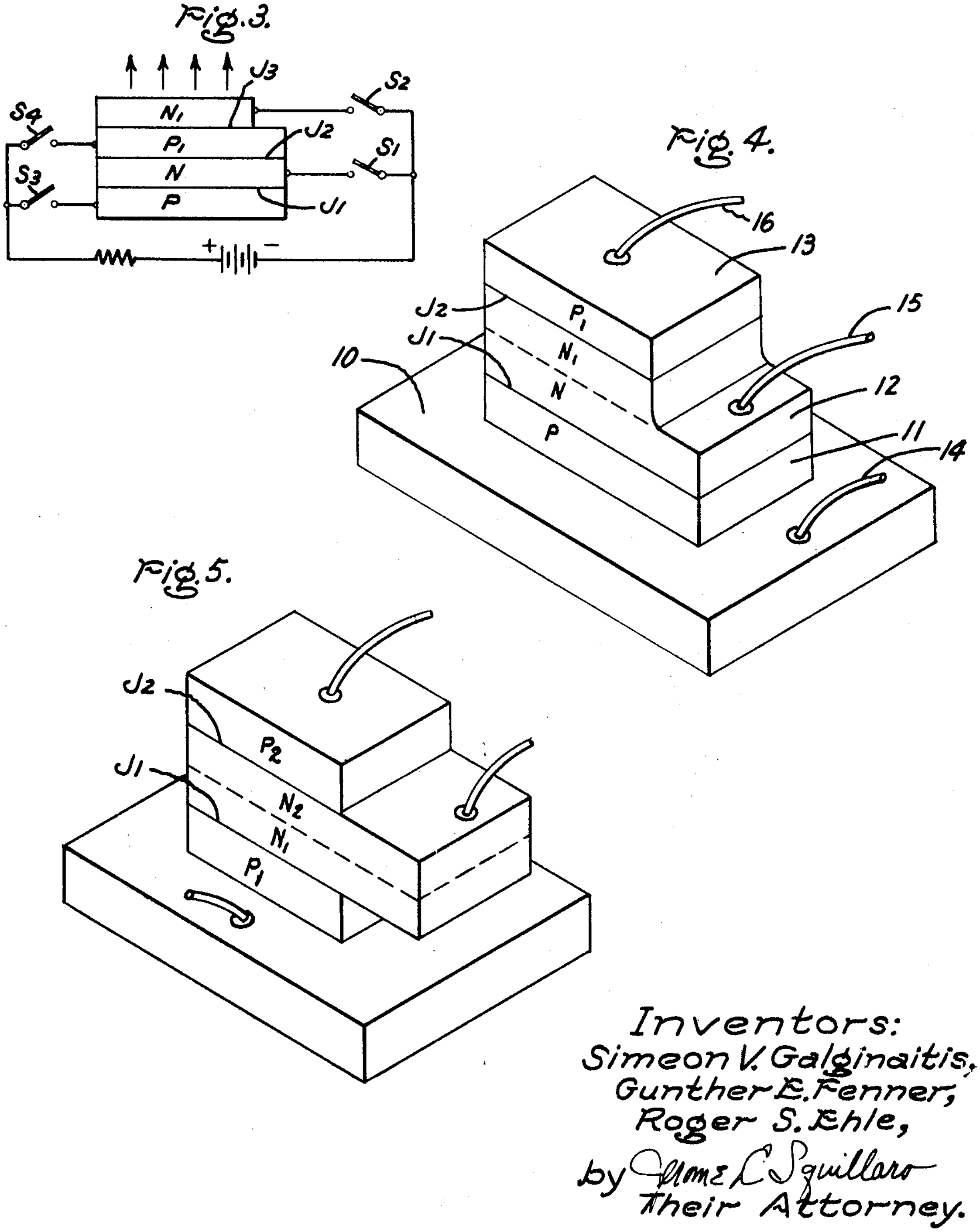
Fig. 4. Fig. 5.
Inventors:
Simeon V. Galginaitis,
Gunther E. Fenner,
Roger S. Ehle,
by James C. Squillaro
Their Attorney.

MULTIPLE COLOR LIGHT EMITTING DIODES

MULTIPLE COLOR LIGHT EMITTING DIODES

The present invention relates to semiconductive light sources and more particularly pertains to multiple color light-emitting diodes.

With the ever increasing demand for new and improved visual display systems, there is need for improved display devices. By virtue of their size and low power requirements, semiconductor light-emitting diodes can be expected to play a larger role as components in future visual display systems. A number of schemes for fabricating arrays containing elements all of which emit light of the same wavelength are described in numerous articles. For example, in the Mar. 4, 1968 issue of Electronics, on page 104, a method for making arrays of gallium arsenide phosphide diodes for use in alpha numeric displays is described. Another article appearing in the Oct. 1967 issue of the IEEE Transactions on Electron Devices, Vol. ED–14, No. 10, describes the fabrication of integrated arrays of electroluminescent diodes. As the sophistication in fabrication and utilization of visual displays increases the use of multiple color displays is a natural extension of the state of the art. An obvious method for obtaining additional colors would be to add additional diodes to the array in order to obtain different colors. This simple solution possesses the disadvantage of adding to the number of element positions in the array, making for unnecessary complexity and difficulty of fabrication. It would therefore be highly desirable to provide multiple color elements having a single element position in a light-emitting diode array.

Accordingly, it is an object of the invention to provide a multiple color light-emitting diode structure from semiconductive materials.

Another object of the invention is to provide methods for fabricating multiple color light-emitting structures suitable for visual display systems.

Still another object of the invention is to provide multiple color light-emitting structures wherein various colors are obtained by simple switching techniques.

Briefly, in accord with a preferred embodiment of the invention, there are provided multiple-layered semiconductive regions of differing conductivity forming light-emitting PN junctions at the interface of two different conductivity type regions. By providing a multiple junction structure, each diode junction can be independently addressed so as to achieve independent color control. For example, properly doped gallium aluminum phosphide, $(GA_xAl_{(1-x)})P$, where $x$ varies from 0 to 1, can be made to luminesce either green or red and by the superposition of red and green emitting junctions, an apparent yellow emission (as far as the human eye is concerned) is also created. To reduce the absorption of green emission, the junction region that interfaces with the medium of transmission, e.g., air, is made as thin as possible or is made of a material with an increased band-gap.

The features of the invention believed to be novel are set forth with particularity in the appended claims. The invention itself, however, both as to its organization and method of operation, together with further objects and advantages thereof, may be best understood by reference to the following description taken in connection with the accompanying drawing in which:

FIG. 1 is a side elevation view of a multiple color light-emitting structure in accord with one embodiment of the invention;

FIG. 2 is a side elevation view of an alternate embodiment of the invention;

FIG. 3 is a side elevation view of still another embodiment of the invention;

FIG. 4 is a perspective view of a typical multiple color light-emitting structure made in accord with the teachings of the instant invention; and FIG. 5 is a perspective view of an alternate embodiment of a multiple color light-emitting structure made in accord with the teachings of the instant invention.

By way of example, FIG. 1 illustrates a multiple color light-emitting structure comprising three superposed layers or regions of different conductivity type semiconductive materials, designated $P_1$, N and $P_2$, respectively, with the two outer P-type layers $P_1$ and $P_2$, separated by the N-type region and forming two PN junctions, $J_1$ and $J_2$, at the interface of $P_1$ and N and $P_2$ and N, respectively. As will be described in greater detail hereinafter, the composition of the various layers may be fabricated such that junction $J_1$, when forward biased, emits light of a different wavelength than that of $J_2$ when forward biased. For example, if $J_1$ and $J_2$ are red-emitting and green-emitting junctions respectively, then by closing switch $S_1$, current flows from the battery in the forward direction across junction $J_1$ and red light is emitted at $J_1$ and a portion thereof, passes through N and $P_2$ as illustrated. When switch $S_2$ is closed, current flows in the forward direction across junction $J_2$ and green light is emitted at $J_2$, passing outward through $P_2$. When both switches are closed, both junctions a forward biased and some hue of yellow is emitted from the structure.

FIG. 2 illustrates a four-layer structure wherein the junction $J_1$ is formed at the interface of a P-type layer $P_1$ and an N-type laYER N superposed over the P-type layer. As illustrated, the junction $J_2$ is formed by an N-type $N_1$ superposed over the N layer and the interface with a P-type layer $P_2$ superposed over the $N_1$ layer. If the junctions $J_1$ and $J_2$ are respectively made red-emitting and green-emitting then by operating the switches $S_1$ and $S_2$ as described above, the same color display is achieved. As will become apparent from the description hereinafter, in some instances, it may be more desirable to utilize the four-layer structure as opposed to the three-layer structure.

In FIG. 3, still another embodiment of the invention is illustrated wherein three light-emitting junctions, $J_1$, $J_2$ and $J_3$, are formed at the interfaces of different conductivity type regions. More specifically, FIG. 3 is illustrative of a semiconductive structure having the capability of emitting color of three different wavelengths either separately or in any combination. As illustrated, junction $J_1$ is formed at the interface of a P-type region, P, and an N-type region, N; junction $J_2$ is formed at the interface of the N region with a -type region, $P_1$; and junction $J_2$ is formed at the interface of region $P_1$ and an N-type region, $N_1$. By appropriately selecting the combination of switches $S_1$ through $S_4$, any and all junctions can be forward biased so as to emit light of different wavelengths.

In the fabrication of multiple color light-emitting diodes as illustrated in FIGS. 1 through 3, it has been discovered that it is desirable to position or locate the light-emitting junction having the lowest photon energy farthest from the surface of emission and the junctions with the highest photon energy located next to the emitting surface so as to reduce absorption of the high energy photons. For example, red emission is achieved at a lower photon energy than green emission and accordingly green emission is more readily absorbed than red emission. Therefore, it is advantageous to place the green-emitting junction as close to the emitting surface as possible. It has been discovered that the absorption of green light may be reduced still further if the layer between the junction and the emitting surface is made as thin as possible. However, since current must be carried to the junction through the layer, there is a practical limit as to how thin the layer may be made. To overcome this problem and to absorption another feature of the instant invention, an alternate way of reducing the absorption is to increase the band-gap of the material forming one of the light-emitting junctions. In a preferred embodiment of the invention, as will be illustrated hereinafter, an increase in band-gap of a gallium phosphide structure is achieved, for example, by the addition of aluminum to the crystal structure.

The multiple color light-emitting source illustrated in FIG. 4 comprises a multiple layered structure substantially similar to that illustrated schematically in FIG. 2 wherein junction $J_1$ is red-emitting and junction $J_2$ is green-emitting. Typically, a diode having such characteristics is readily fabricated on a substrate 10 with a first layer 11 of P-type conductivity material such as, for example, gallium phosphide doped with a suitable acceptor impurity such as zinc, cadmium or mercury and also with oxygen, or similar deep level impurities which act as donors. The junction $J_1$ is formed by superposing over the layer 11, an N-type layer 12 such as gallium phosphide doped with a suitable donor impurity such as tellurium, selenium or sulfur. The layer 12 is preferably formed by a liquid epitaxy process described in greater detail hereinafter. To complete the formation of multiple layered structure, as for example, where a three-layer structure is to be formed, a gallium phosphide layer, acceptor doped with zinc, for example, can be epitaxially grown over the layer 12. In order that contact may be made to the N-layer, a portion of the layers 12 and 13 must be removed, as for example, by masking and etching techniques. Alternately, before application of the layer 13, the layer 12 could be masked so as to restruct the epitaxial growth of layer 13 to a specific area. By whatever method employed, contacts 14, 15 and 16 are made to the first, second and third layers, respectively, of the diode structure.

In the event that it is desired to fabricate a four-layer device such as that illustrated schematically in FIG. 2, wherein the junction $J_2$ is fabricated with a material having an increased energy band-gap, the structure may be fabricated in the following manner. A red-emitting junction $J_1$ may be formed as described above with a P-type region of acceptor-doped gallium phosphide containing oxygen and an N-type region of donor-doped gallium phosphide. An increased band-gap material of N-type conductivity such as gallium aluminum phosphide donor-doped with tellurium, for example, may next be grown by an epitaxial growth process. Similarly, a P-type region may be grown over the N-type region to form the green-emitting junction $J_2$ by growing acceptor-doped gallium aluminum phosphide over the N-type layer. As described above, light-emitting diode structures having an increased band-gap exhibit reduced absorption properties over lower band-gap materials with the same emission wavelength.

Still an alternate embodiment of the invention is illustrated in FIG. 5 where a four-layer structure substantially similar to that illustrated schematically in FIG. 2 is fabricated such that the area of the emitting junction $J_1$ is substantially equal to the area of the emitting junction $J_2$. In situations where it is desirable to utilize red- and green-emitting junctions separately and in combination so as to provide a third color having a yellow hue, it is desirable to have the red- and green-emitting junctions of substantially the same area. Otherwise, the light emitted will comprise either red and yellow or green and yellow or, even possible, a combination of all three. While in some applications, this may not be objectionable, in instances where it is, the problem can be eliminated by making the emitting junctions of substantially the same area and in axial alignment with each other.

Having thus described several embodiments of the invention, several preferred methods for making these and other devices will now be described. By way of example, five basic methods are described for making multilayers structures illustrated herein; however, it is to be understood that various combinations of these methods or other methods can likewise be employed.

One method for producing a layer of gallium phosphide useful in practicing the instant invention is to lap and polish slice of appropriately doped material which has been grown by "-pulling from a melt." This method is well known in the art and will be described in no further detail herein.

A second method for making a multilayered structure is to grow a platelet by cooling an appropriately doped solution of gallium phosphide in gallium. By way of example, platelets may be grown from solution by placing a mixture of gallium with 16 percent gallium phosphide by weight in a quartz ampoule. To this mixture is added a proper amount of dopant, suitable for the particular layer to be grown. For example, about 0.05 mole percent zinc and about 0.1 mole percent $GA_2O_3$ will yield P-type material suitable for use in red-emitting diode structures.

On the other hand the use of about 0.03 mole percent tellurium will result in N-type material. In both instances, the ampoule is then evacuated to a pressure of about $10^1$torr. and sealed off. The ampoule is placed in a furnace, heated to about 1200° C., and then cooled at a rate of about 1° per minute. As the solution cools, the solubility of the gallium phosphide in the gallium decreases, and gallium phosphide crystallizes in the form of platelets.

A third method for producing multilayered structures is to grow semiconductor material by means of a vapor phase epitaxy process. This may be accomplished by using a furnace in which two temperature zones are established. A quantity of gallium is placed in a high temperature zone, of approximately 950° C., and a suitable rate is placed in a temperature zone, approximately 850° C. The substrate may be gallium arsenide if an initial layer of gallium phosphide is being grown or the substrate may be gallium phosphide if some subsequent layer is to be grown. In either event, the gallium source and substrate are contained in a tube made of quartz or other suitable material through which a stream of purified hydrogen gas flows and acts as a carrier gas. Part of the hydrogen flow is diverted through a bubbler containing $PC1_3$, and then redirected back to the main gas stream. The $PC1_3$ vapor thus acquired serves as a source of phosphorus, and provides the chlorine, which upon chemically combining with the gallium in the hot zone, forms volatile gallium chlorides. These various vapors move through the tube where they can then react at the substrate to produce single crystal layers of gallium phosphide. Particularly favorable results have been obtained with the following conditions: a 950° C., temperature in high temperature zone and an 840° C., temperature in the low temperature zone with the hydrogen flow rate of 100 cc./min. and a bypass flow rate through the $PC1_3$ of 50 cc./min. with the temperature of $PC1_3$ held at 0° C.

Obviously, if doped layers are desired, dopants can be added to the gallium source, or the impurity can be added in vapor form through a separate inlet tube, or some solid source for the impurity can be placed in an appropriate temperature region in the tube to effect the desired doping level.

Still another method for making multilayer structures is to grow semiconductor material by means of a liquid phase epitaxy process. In this situation, a system is employed wherein a solution of gallium phosphide in gallium can initially be kept separated from a substrate or substrates. Appropriate elements are added to the solution to serve as dopants. If the dopant materials are not too volatile, the system can consist of a tube open at both ends through which a protective gas flows continuously. If the dopant is quite volatile, like zinc or sulfur, it may be more expedient, although not absolutely necessary, to use a sealed, evacuated quartz system. In a horizontal system, the gallium phosphide solution and substrate can be held in a boat made of graphite, boron nitride, alumina or quartz, for example. In a vertical system, the gallium phosphide solution can be contained in a cup and the substrate held above it in a suitable moveable holder. In operation, the system is heated to a temperature of approximately 1050° C., and allowed to remain at this temperature long enough to insure saturation and then the solution is brought into contact with the substrate either by tipping the solution over onto the substrate or by dipping the substrate into the solution. The solution is cooled at a suitable rate to grow epitaxial layers, such as, for example, 0.1° to 25°/min. In the vertical system, growth can be interrupted by raising the substrate out of the solution at any time.

It is also possible to grow PN junctions in a single growth cycle by adding, during the course of the growth, a sufficient amount of impurity of the opposite type so that the original impurity becomes compensated and a layer of opposite type conductivity begins to grow.

Still another method for making multilayered structures is by a diffusion process. In this instance, a light-emitting junction can be formed by enclosing a gallium phosphide wafer, for example, in a sealed quartz capsule with a few milligrams of the desired impurity, as for example, zinc, and several milligrams of phosphorus. The capsule is placed in a furnace at about 900 C., for about 1 hour. A zinc-doped region, about 15 microns thick, will then be formed at the surface of the wafer. Selective diffusion, i.e., diffusion restricted to limited areas of the wafer, can be achieved by masking with suitably patterned layers of oxides or nitrides of silicon or other impermeable films.

The foregoing process can be used individually or in any desired combination to fabricate multilayered devices as described above. For example, a multiple colored light-emitting diode structure having four layers may be fabricated as follows: a substrate layer 11 is grown from a solution of gallium, containing 16 percent by weight of gallium phosphide, 0.05 mole percent of zinc and 0.1 mole percent of gallium oxide. The solution is heated to approximately 1200° C., in an evacuated quartz ampul and cooled at a rate of approximately 1°/min. Platelets of gallium phosphide grown from this solution are then lapped and etched in aqua regia before use as a seed crystal for the multiple layer structure. The substrate layer thus formed may then be used for subsequent epitaxial layer growths. For example, the substrate may be dipped into a solution of 7 percent by weight of gallium phosphide and 0.01 atom percent of tellurium at a temperature of approximately 1050° C. The solution is cooled at a rate of approximately 0.7° C./min. to a temperature of approximately 1000° C. This produces a tellurium doped layer of approximately 50 micron thickness over the zinc and oxygen doped gallium phosphide layer. A third layer of semiconductor material having a higher band-gap is then formed by adding aluminum to the melt described above and the temperature increased by approximately 50°–10° C. The solution then is allowed to cool at a rate of approximately 0.7° C./min. to a temperature of 990° C. This produces an N-type gallium aluminum phosphide layer of approximately 20 micron thickness. To the 990° C. temperature melt, approximately 0.1 atom percent of zinc is added and the temperature again increased by approximately 5°–10° C. The melt is again permitted to cool from this temperature to approximately 900° C. at a rate of approximately 0.7° C./min. This produces a P-type layer of gallium aluminum phosphide having a thickness of approximately 20 microns. The resultant device is substantially the same as that illustrated schematically in FIG. 2.

The device thus formed may be electrolytically etched in potassium hydroxide solution to fabricate devices as illustrated in FIGS. 4 and 5. Suitable contacts may be applied to the different regions so that electrical contact can be made thereto.

It is to be understood that the foregoing specific illustration of a method for fabricating a multiple color structure is given merely by way of example and not meant to limit the methods for making such structures. For example, the various processes described above and others shown in the art may be utilized in any combination to make multiple color structures. Additionally, it should be appreciated that the number of layers need not be limited to those illustrated herein, but can be extended to achieve a multiplicity of colors. In general, however, three colors are sufficient to achieve all visible colors of the spectrum. Also, it should be understood that complementary structures can also be fabricated in accord with the teachings of the instant invention.

It should be further understood that although the invention has been described primarily with reference to gallium phosphide, other semiconductor materials or combinations of semiconductor materials can be used to achieve these multiple color light-emitting structures. For example, ternary compounds such as $Ga(As_xP_{(1-x)})$ where $x$ varies from 0 to 1, can be used. Therefore, the appended claims are intended to cover all such modifications and changes as fall within the true spirit and scope of the invention.

In summary, devices fabricated in accord with the teachings of the instant invention provide multiple color light-emitting structures useful in visual display systems with the attendant advantage of providing high density arrays of such structures.

What is claimed as new and desired to be secured by Letters Patent of the U.S. is:

1. A multiple color light-emitting structure comprising:
a first layer of one conductivity type gallium phosphide;
a second layer of an opposite conductivity type gallium phosphide overlying said first layer and forming a first light-emitting junction therewith;
a third layer of said one conductivity type gallium phosphide overlying said second layer wherein said third layer of said one conductivity type gallium phosphide comprises gallium aluminum phosphide $(Ga_xAl_{(1-x)}P)$ wherein X is greater than 0 but less than 1 and forming a second light-emitting junction therewith, said third layer having a band-gap greater than said first or second layers; and
means for forwardly biasing said first and said second light-emitting junctions either separately or simultaneously to cause separate or simultaneous light emission, respectively, from said first and second light-emitting junctions.

2. The multiple color light-emitting structure of claim 1 wherein said third layer has a surface which interfaces with the medium of transmission and light emission from said first and second light-emitting junctions passes therethrough.

3. The multiple color light-emitting structure of claim 1 wherein said light-emitting junctions are of substantially the same area and in axial alignment with each other.

4. The multiple color light-emitting structure of claim 1 wherein said first light-emitting junction has an emission of a lower photon energy than said second light-emitting junction.

5. A multiple color light-emitting structure comprising:
a first layer of one conductivity-type gallium phosphide;
a second layer of an opposite conductivity-type gallium phosphide overlying said first layer and forming therewith a first light-emitting junction at the interface;
a third layer of said opposite conductivity-type gallium phosphide overlying said second layer; and
a fourth layer of said one conductivity-type gallium phosphide overlying said third layer and forming therewith a second light-emitting junction, said third and/or said fourth layers having a higher band gap than said first and second layers for reducing absorption of light passing therethrough wherein said higher band gap layers include compositions of gallium aluminum phosphide, $(Ga_xAl_{(1-x)}P)$, where X varies from 0 to 1. means for forward biasing said first and/or second light emitting junctions separately or simultaneously to cause light emission therefrom.

6. The multiple color light-emitting structure of claim 5 wherein the emission from said first light-emitting junction has a lower photon energy than from said second light-emitting junction and said second light-emitting junction is located closer to the light-emitting surface which interfaces with the media of transmission.

7. The multiple color light-emitting structure of claim 5 wherein said light-emitting junctions are of substantially the same area and in axial alignment with each other.